United States Patent
Sano et al.

(10) Patent No.: US 8,917,804 B2
(45) Date of Patent: Dec. 23, 2014

(54) CLOCK DATA RECOVERY CIRCUIT AND WIRELESS MODULE INCLUDING SAME

(75) Inventors: Eiichi Sano, Sapporo (JP); Yoshihito Amemiya, Sapporo (JP)

(73) Assignee: National University Corporation Hokkaido University, Hokkaido (JP)

( * ) Notice: Subject to any disclaimer, the term of this patent is extended or adjusted under 35 U.S.C. 154(b) by 0 days.

(21) Appl. No.: 13/985,949

(22) PCT Filed: Feb. 17, 2011

(86) PCT No.: PCT/JP2011/053416
§ 371 (c)(1),
(2), (4) Date: Sep. 16, 2013

(87) PCT Pub. No.: WO2012/111133
PCT Pub. Date: Aug. 23, 2012

(65) Prior Publication Data
US 2014/0003566 A1    Jan. 2, 2014

(51) Int. Cl.
*H04L 7/06* (2006.01)
*H03L 7/08* (2006.01)
*H04L 7/027* (2006.01)
*H04L 7/033* (2006.01)

(52) U.S. Cl.
CPC .............. *H04L 7/065* (2013.01); *H03L 7/0807* (2013.01); *H04L 7/0276* (2013.01); *H04L 25/04902* (2013.01); *H04L 7/0331* (2013.01)
USPC ............ 375/364; 375/238; 375/316; 375/326

(58) Field of Classification Search
CPC ..... H04L 7/065; H04L 7/0276; H04L 7/0331; H04L 25/4902; H03L 7/0807
USPC .................................. 375/238, 316, 326, 364
See application file for complete search history.

(56) References Cited

FOREIGN PATENT DOCUMENTS

| JP | 61-072454 A | 4/1986 |
|----|-------------|--------|
| JP | 2003-330569 A | 11/2003 |

OTHER PUBLICATIONS

International Preliminary Report on Patentability isued in International Application No. PCT/JP2011/053416 dated Aug. 29, 2013.
Nathan M. Pletcher et al., "A 52 uW Wake-Up Receiver With −72 dBm Sensitivity Using an Uncertain-IF Architecture", IEEE Journal of Solid-State Circuits, Jan. 2009, pp. 269-280, vol. 44, No. 1.
International Search Report for PCT/JP2011/053416 dated Apr. 12, 2011 English Translation.

*Primary Examiner* — Leon Flores
(74) *Attorney, Agent, or Firm* — Sughrue Mion, PLLC

(57) ABSTRACT

A clock data recovery circuit includes a ring oscillator, an oscillation control circuit unit to start or stop the ring oscillator according to existence or absence of a PWM signal, a counter circuit unit to count pulse signals to hold N bits of count value, a register circuit unit which is configured to transmit upper M bits of count value, as a reference count value, in response to a transmission signal, a comparison circuit unit to output a timing clock when the count value exceeds the reference count value, and a transmission control circuit unit to be synchronized with a rising timing of the PWM signal to generate the transmission signal and a reset signal for resetting the counter circuit unit.

4 Claims, 7 Drawing Sheets

(a)

(b)

(c)

CLOCK DATA RECOVERY CIRCUIT AND WIRELESS MODULE INCLUDING SAME

CROSS-REFERENCE TO RELATED APPLICATIONS

This application is a National Stage of International Application No. PCT/JP2011/053416, filed on Feb. 17, 2011, the contents of all of which are incorporated herein by reference in their entirety.

TECHNICAL FIELD

The present invention relates to a clock data recovery circuit for recovering a clock from a baseband signal, and a wireless module including the same.

BACKGROUND ART

Recently, attention is paid to a sensor network as an important technology in the field of information communication technology. In order to enable a sensor network to pervade society, it is necessary to resolve various issues in relation to systematization technology and hardware technology. Among those issues, an ultra low power consumption integrated circuit technology corresponds to one of technologies having the key to put sensor network to practical use. In order to maintain monitor sensors of a structure or a communication environment of a large number of constructed networks, an enormous labor force is necessary. Therefore, it is required to realize a maintenance free monitoring sensor, and an integrated circuit having a function of processing and transferring sensing information requires a property of ultra low power consumption of a microwatt class, which enables the integrated circuit to operate for at least 10 years using a small-sized battery or natural energy (see Non Patent Literature 1 below).

FIG. 5 illustrates an example of the configuration of a conventional sensor apparatus. The conventional sensor apparatus includes an A/D converter for converting an analog signal from a sensor to a digital signal, an encoder for encoding the digital signal, a modulator for modulating the encoded digital signal, an amplifier for amplifying the modulated signal, and transmitting the amplified signal through an antenna, and a wakeup receiver for receiving a signal from the outside through the antenna. Upon receiving a command signal from an external device, such as a data collecting device, the conventional sensor apparatus starts to perform a monitoring function. Among the elements of the sensor apparatus, only the wakeup receiver constantly operates to monitor a command signal. The other elements of the sensor apparatus are normally in an off state and are turned on by a signal from the wakeup receiver. The conventional sensor apparatus as described above can achieve low power consumption to some degree.

FIG. 6 illustrates an example of the configuration of a wireless receiver used as the wakeup receiver constituting the conventional sensor apparatus described above. In the coherent type wireless receiver 901 illustrated in FIG. 6, a phase-modulated or an amplitude-modulated signal is received by an antenna 902, the received signal is amplified by a low noise amplifier 903, and the amplified signal is then mixed with an output of a voltage controlled oscillator 904 having been adjusted to oscillate with the same frequency as a carrier, so that the amplified signal is converted to a baseband signal. Further, a clock data recovery circuit 906 reproduces a clock from the baseband signal amplified by the amplifier 905 and reproduces digital data while adjusting the timing according to this clock.

CITATION LIST

Non Patent Literatures

Non Patent Literature 1: N. M. Pletcher, S. Gambini, and J. Rabaey, "A 52 µW wake-up receiver with −72 dBm sensitivity using an uncertain-IF architecture," IEEE J. Solid-State Circuits, vol. 44, no. 1, pp. 269-280, January 2009.

SUMMARY OF INVENTION

Technical Problem

The clock data recovery circuit 906 used in the conventional wireless receiver 901 described above reproduces a clock signal from the demodulated baseband signal, and decides digital values "0" and "1" of the baseband signal based on the reproduced clock signal. Since the clock data recovery circuit 906 requires an integration circuit or a filter including a resistor and a capacitor, the area of the clock data recovery circuit has a tendency to increases. Further, since clock data recovery circuit 906 needs to constantly operate even when it does not receive a command signal from an external device, it has a limitation in achieving the low power consumption.

Therefore, the present invention has been made in view of the above problems, and an object of the present invention is to provide a clock data recovery circuit, which can reduce the size and the power consumption of the circuit, and a wireless module including the clock data recovery circuit.

Solution to Problem

In order to solve the above problem, a clock data recovery circuit according to an aspect of the present invention includes: an oscillator configured to generate a pulse signal; a first control circuit unit configured to start and stop an operation of the oscillator according to existence or absence of an input of a Pulse Width Modulation (PWM) signal; a counter configured to count the pulse signal so as to hold a count value in N number of bit counters, wherein N is a natural number; a register including M number of bit registers, wherein M is a natural number smaller than N, the register being configured to transmit upper M bits of the count value held by the N number of bit counters, as a reference count value, in response to input of a transmission signal; a comparator configured to compare the count value held by the counter with the reference count value held by the register and output a timing clock when the count value exceeds the reference count value; and a second control circuit unit configured to be synchronized with a rising timing of the PWM signal to generate the transmission signal for transmitting the reference count value from the counter to the register and a reset signal for resetting the counter.

According to this clock data recovery circuit, the count value of the pulse signal generated by the oscillator is held by the counter, upper bits of the count value are transmitted as a reference count value from the counter to the register at a rising edge of an input PWM signal, and simultaneously, the count value of the counter is reset. Further, when the count value of the counter exceeds the reference count value, a timing clock is generated. Therefore, since a timing clock for determining a digital value of a PWM signal is generated based on a cycle of another PWM signal one stage before the PWM signal, an oscillator of a high precision is unnecessary. Further, as a configuration for determining the timing for generation of the timing clock, a configuration of transmitting upper bits of a count value held by the counter to the register is employed. Moreover, the operation of the oscillator is stopped when there is no input of a PWM signal. As a result, it is possible to reduce the scale of the circuit and effectively reduce the power consumption.

Another aspect of the present invention provides a wireless module, which includes: the clock data recovery circuit described above; an antenna configured to receive the PWM signal; and an amplifier configured to amplify the PWM signal. This wireless module can reduce the scale of the circuit and reduce the power consumption.

Advantageous Effects of Invention

As described above, according to the present invention, it is possible to reduce the size and the power consumption of the clock data recovery circuit.

DESCRIPTION OF EMBODIMENTS

Figure 1:
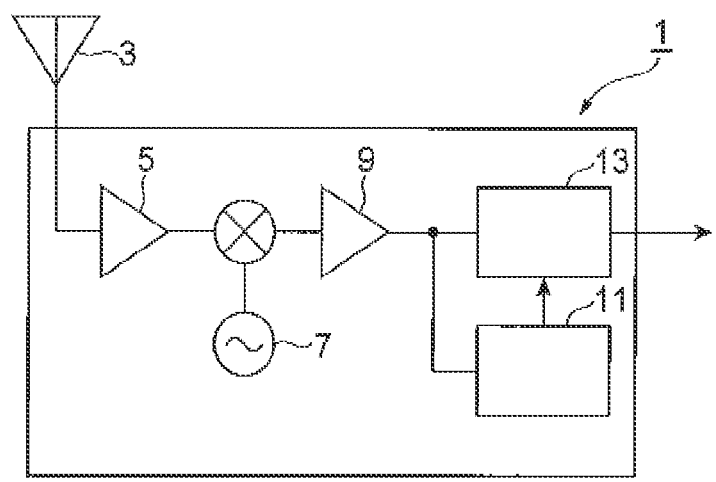
FIG. 1 is a block diagram illustrating the configuration of a wireless receiver 1 according to an exemplary embodiment of the present invention.

The concept of the present invention can be easily understood by considering the following detailed description with reference to the accompanying drawings illustrated as examples. Subsequently, embodiments of a clock data recovery circuit of the present invention and a wireless module including the circuit will be described. If possible, the same elements will be designated by the same reference numerals.

A wireless receiver, which corresponds to a wireless module capable of receiving a PWM signal and reproducing digital data, will now be described. FIG. 1 is a block diagram illustrating the configuration of a wireless receiver 1 according to an exemplary embodiment of the present invention. In the wireless receiver 1, an antenna 3 receives a PWM signal and a low noise amplifier 5 amplifies the received signal. Then, the amplified signal is mixed with an output of a voltage controlled oscillator 7 having been adjusted to oscillate with the same frequency as that of a carrier of the PWM signal, so that the amplified signal is converted to a baseband signal. Further, in the wireless receiver 1, the baseband signal is amplified by an amplifier 9 and is then input to a clock data recovery circuit 11 so as to reproduce a timing clock. Then, by using the reproduced timing clock, a flip-flop 13 reproduces and outputs digital data from the baseband signal. That is to say, the flip-flop 13 included in the wireless receiver 1 not only decides digital values "0" and "1" of the baseband signal based on the timing clock reproduced from the baseband signal, but also adjusts the output timing of a signal indicating the decided digital values based on the timing clock, so as to output digital data.

Figure 2:
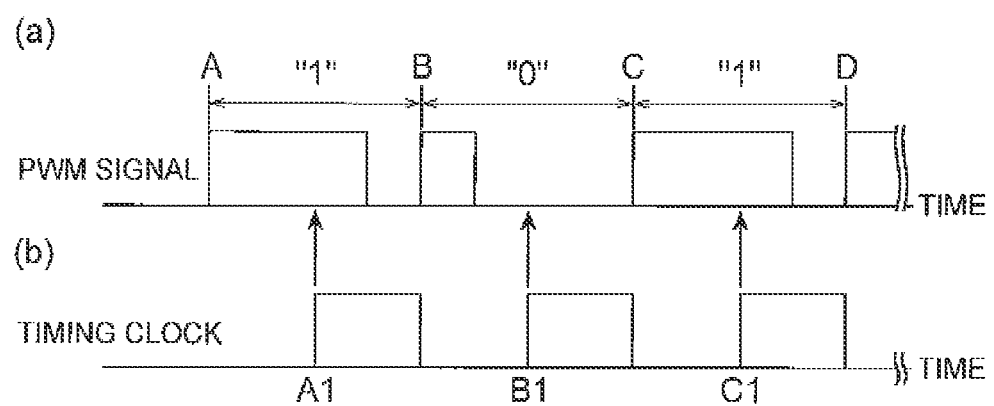
FIG. 2 is a timing chart which illustrates a baseband signal of a PWM signal processed by a clock data recovery circuit 11 of FIG. 1 and a timing clock generated by the clock data recovery circuit 11 for the baseband signal.

FIG. 2 is a timing chart which illustrates a baseband signal of a PWM signal processed by the clock data recovery circuit 11 and a timing clock generated by the clock data recovery circuit 11 for the baseband signal.

In the PWM signal, the digital data "0" and "1" are expressed by durations of pulses (see (a) of FIG. 2). The pulses of the PWM signal rise at the same cycle. For example, each of a time interval AB between a time point A and a time point B and a time interval BC between a time point B and a time point C corresponds to one bit of data. Further, in each cycle, the digital value of "1" is indicated by a pulse having a long duration, such as the time interval AB, and the digital value of "0" is indicated by a pulse having a short duration, such as the time interval BC. In order to demodulate the PWM signal as described above, the clock data recovery circuit 11 generates a timing clock (see (b) of FIG. 2) rising in the middle of each cycle, and the flip-flop 13 reads an amplitude value of the PWM signal at the rising edges (time points A1, B1, and C1). Then, if a pulse of the PWM signal has a large amplitude, that is, if the pulse is in a risen state, the flip-flop 13 decides that the pulse has a digital value of "1". If a pulse of the PWM signal has a small amplitude, that is, if the pulse is in a fallen state, the flip-flop 13 decides that the pulse has a digital value of "0". Further, when either one or both of the pulse of the PWM signal and the timing clock have reverse polarities, the clock data recovery circuit 11 and the flip-flop 13 may also reproduce a timing clock or generate digital data. In addition, the flip-flop 13 may decide a long pulse as having a digital value of "0" and a short pulse as having a digital value of "1". Moreover, a typical PWM signal is set such that the digital value of "1" implies that the pulse duration of the PWM signal occupies 70% to 90% of the cycle of the PWM signal and the digital value "0" implies that the pulse duration of the PWM signal occupies 10% to 30% of the cycle. In order to reproduce digital data from the PWM signal as described above, it is necessary to set the timing clock to rise at a time point between 40% and 60% of the cycle.

Figure 3:
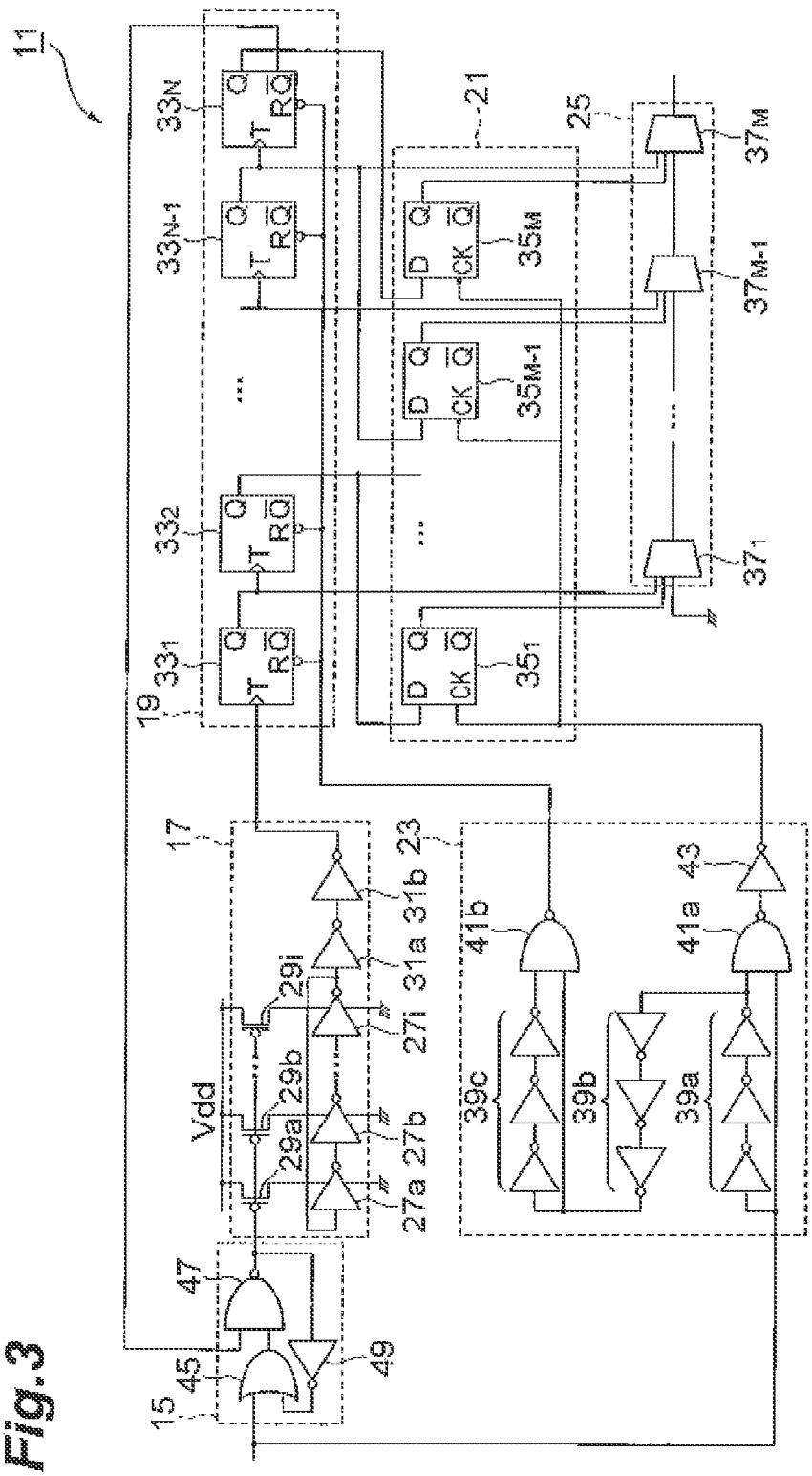
FIG. 3 is a circuit block diagram illustrating main parts of the clock data recovery circuit 11 of FIG. 1.

FIG. 3 is a circuit block diagram illustrating main parts of the clock data recovery circuit 11 shown in FIG. 1. As shown in FIG. 3, the clock data recovery circuit 11 includes an oscillation control circuit unit 15, a ring oscillator 17, a counter circuit unit 19, a register circuit unit 21, a transmission control circuit unit 23, and a comparison circuit unit (comparator) 25. The clock data recovery circuit 11 employs, for example, a 0.35 μm-CMOS device. A transistor having an aspect ratio of 1 μm/0.35 μm (gate width/gate length=1 μm/0.35 μm) is used for each transistor, and an oscillator having an aspect ratio of 1 μm/5 μm is used for the ring oscillator 17.

The ring oscillator 17 includes a 9-stage inverter and generates an oscillation pulse signal which oscillates at a frequency higher than the frequency of the input PWM signal, for example, which oscillates at 2.6 MHz when the frequency of the PWM signal is 50 kHz. Specifically, the ring oscillator 17 includes 9 stage inverters 27a, 27b, . . . , and 27i connected in the shape of a ring, transistors 29a, 29b, . . . , and 29i configured to supply a power source voltage Vdd to the inverters 27a, 27b, . . . , and 27i, respectively, and inverters 31a and 31b configured to delay an oscillation pulse signal. The transistors $29a, 29b, \ldots$, and $29i$ are connected to the output of the oscillation control circuit unit 15. When a control signal output from the oscillation control circuit unit 15 indicates "0", the transistors $29a, 29b, \ldots$, and $29i$ supply the power source voltage Vdd to the inverters $27a, 27b, \ldots$, and $27i$, so as to generate an oscillation operation. Meanwhile, when the control signal output from the oscillation control circuit unit 15 indicates "1", the transistors $29a, 29b, \ldots$, and $29i$ stops the supplying of the power source voltage Vdd to the inverters $27a, 27b, \ldots$, and $27i$, so as to stop the oscillation operation.

The counter circuit unit 19, which is a circuit which counts the number of pulses of an oscillation pulse signal output from the ring oscillator 17, includes N number (N is a natural number) of bit counters, which are cascade-connected Toggle flip-flops (hereinafter, referred to as "T flip-flops") $33_1$ to $33_N$. That is to say, an output of the ring oscillator 17 is connected to a T input of the first stage T flip-flop $33_1$, a Q output (normal output) of the first stage T flip-flop $33_1$ is connected to a T input of the second stage T flip-flop $33_2$, and Q outputs of previous stage T flip-flops are sequentially connected to T inputs of post stage T flip-flops, respectively. Further, a QB output (inverse output) of the final stage T flip-flop is connected to the oscillation control circuit 15 which will be described later. Moreover, the output of the transmission control circuit unit 23 is connected to R inputs (reset inputs) of the T flip-flops $33_1$ to $33_N$.

In the counter circuit unit 19 having the configuration described above, according to an input of an oscillation pulse signal from the ring oscillator 17, a pulse count value of the oscillation pulse signal is held by the T flip-flops $33_1$ to $33_N$, and pulse count values of lower bits to upper bits are held in the sequence of the T flip-flops $33_1$ to $33_N$, respectively. Further, the pulse count values held by the T flip-flops $33_1$ to $33_N$ can be reset by a reset signal from the transmission control circuit unit 23.

The register circuit unit 21, which are bit registers of M stages (M is a natural number smaller than N), includes Delayed flip-flops (hereinafter, referred to as "D flip-flops") $35_1$ to $35_M$ and is configured to allow upper M bits of the pulse count value held by the counter circuit unit 19 to be transmitted as a reference count value from the counter circuit unit 19 to the register circuit unit 21 according to a transmission signal from the transmission control circuit unit 23. That is, a Q output of the final stage T flip-flop $33_N$ is connected to a D input of the final stage D flip-flop $35_M$, and a Q output of the T flip-flop $33_{N-1}$ one stage before the final stage T flip-flop is connected to a D input of the D flip-flop $35_{M-1}$ one stage before the final stage D flip-flop. In the same way, to D inputs of the other D flip-flops $35_{M-2}$ to $35_1$, Q outputs of the T flip-flops at the same stages calculated from the final stage as those of the other D flip-flops are connected, respectively. FIG. 3 illustrates a case in which M=N−1, wherein a Q output of the T flip-flop $35_2$ at the (N−1)th stage calculated from the final stage is connected to the D input of the first stage D flip-flop $35_1$. Further, the output of the transmission control circuit unit 23 is connected to a CK input (clock input) of each of the D flip-flops $35_1$ to $35_M$.

When the register circuit unit 21 has received a transmission signal from the transmission control circuit unit 23, upper M bits among the bits held by the T flip-flops $33_1$ to $33_N$ are transmitted to and held by the D flip-flops $35_1$ to $35_M$. In this event, lower to upper bits of the reference count value are held in the sequence of the D flip-flops $35_1$ to $35_M$. For example, in the case where M=N−1, since upper (N−1) bits among the N bits of pulse count value are transmitted, a reference count value corresponding to nearly 0.5 times of the pulse count value is held in the register circuit unit 21.

The comparison circuit unit 25 includes M number of comparators $37_1$ to $37_M$, which is the same number as that of the D flip-flops $35_1$ to $35_M$. The comparison circuit unit 25 compares the pulse count value held by the counter circuit unit 19 and the reference count value held by the register circuit unit 21 with each other, so as to output a pulse-shaped timing clock at a time point at which the pulse count value exceeds the reference count value. The comparators $37_1$ to $37_M$ are, for example, CMOS comparators. The Q output of the first stage T flip-flop $33_1$ and the Q output of the first stage D flip-flop $35_1$ are connected to an input of the comparator $37_1$, and the comparator $37_1$ compares the two Q outputs with each other and outputs an ON state comparison result signal when the two Q outputs coincide with each other. Further, the Q output of the second stage T flip-flop $33_2$ and the Q output of the second stage D flip-flop $35_2$ are connected to an input of the comparator $37_2$, and the comparator $37_2$ outputs an ON state comparison result signal when the output of the comparator $37_1$ is in the ON state and the two Q outputs coincide with each other. Next, in the same manner, the Q output of the $k^{th}$ stage T flip-flop $33_k$, the Q output of the $k^{th}$ stage D flip-flop $35_k$, and the output of the comparator $37_{k-1}$ are connected to an input of the comparator $37_k$ (k is a natural number larger than or equal to 3 and smaller than or equal to M), and the comparator $37_k$ outputs an ON state comparison result signal when the output of the comparator $37_{k-1}$ is in the ON state and the two Q outputs coincide with each other. Further, the comparator $37_M$ outputs an comparison result signal as a pulse-shaped timing clock. As a result, the comparison circuit unit 25 generates a timing clock at every time point when lower M bits of the pulse count value held by the T flip-flops $33_1$ to $33_M$ coincide with M bits of the reference count value held by the D flip-flops $35_1$ to $35_M$.

The transmission control circuit unit 23 controls timing of transmission of a reference count value from the counter circuit unit 19 to the register circuit unit 21 and reset timing of the counter circuit unit 19, outputs a reset signal to the register circuit unit 21, and outputs a transmission signal to the register circuit unit 21. The transmission control circuit unit 23 includes three delay circuits $39a$, $39b$, and $39c$ each including 3 stage inverters, two NAND circuits $41a$ and $41b$, and an inverter 43.

A baseband signal is input from the exterior to one input terminal of the NAND circuit $41a$ of the transmission control circuit unit 23 and a delayed and inverted baseband signal is input through a delay circuit $39a$ to the other input terminal of the NAND circuit $41a$. Further, the output of the NAND circuit $41a$ is connected through the inverter 43 to each of CK inputs of the D flip-flops $35_1$ to $35_M$ of the register circuit unit 21. The NAND circuit $41a$ as described above operates to output an ON state transmission signal for transmitting a reference count value at the rising timing of the pulse of the baseband signal.

A delayed baseband signal is input through the delay circuits $39a$ and $39b$ to one input terminal of the NAND circuit $41b$ of the transmission control circuit unit 23, and a further delayed and inverted baseband signal is input through the delay circuits $39a$, $39b$, and $39c$ to the other input terminal of the NAND circuit $41b$. Further, the output of the NAND circuit $41b$ is connected to the R input of each of the T flip-flops $33_1$ to $33_N$ of the counter circuit unit 19. The NAND circuit $41a$ operates to output an ON state reset signal for resetting the counter circuit unit 19 at a time point which belongs to a rising duration of the pulse wave of the baseband signal and is delayed from the output time point of the transmission signal.

The oscillation control circuit unit 15 starts or stops the operation of the ring oscillator 17 according to existence or absence of an input of a baseband signal of the PWM signal from the exterior. Specifically, the oscillation control circuit unit 15 includes an OR circuit 45, a NAND circuit 47, and an inverter 49. The baseband signal is input to one input terminal of the OR circuit 45 and an output of the inverter 49 is input to the other input terminal of the OR circuit 45. Further, the QB output of the final stage T flip-flop $33_N$ of the counter circuit unit 19 is input to one input terminal of the NAND circuit 47, the output of the OR circuit 45 is input to the other input terminal of the NAND circuit 47, and the output of the NAND circuit 47 is inverted and then input to gate terminals (control terminals) of the transistors 29a, 29b, . . . , 29i of the ring oscillator 17. In addition, the output of the NAND circuit 47 is provided to the input of the inverter 49, and the output of the inverter 49 is returned to the input of the OR circuit 45. Table 1 is a truth table of inputs and outputs of the oscillation control circuit unit 15.

TABLE 1

| PWM signal state | PWM signal | QB output | OR output | NAND output | Transistor operation state |
|---|---|---|---|---|---|
| Initial state | 0 | 0 | 0 | 1 | OFF |
| Signal ON | 1 | 1 | 1 | 0 | ON |
| Signal OFF | 0 | 1 | 1 | 0 | ON |
| Maximum count value after signal OFF | 0 | 0 | 0 | 1 | OFF |

As noted from the above Table 1, in the initial state, the PWM signal is not input, the signal level is "0", and the QB output of the counter circuit unit 19 also indicates "0". In this state, since the output of the NAND circuit 47 indicates "1", the transistors 29a, 29b, . . . , 29i of the ring oscillator 17 are in the OFF state and the ring oscillator 17 thus does not oscillate. Further, if the pulse of the PWM signal rises to "1", the QB output of the T flip-flop $33_N$ is changed to "1" by the reset signal of the transmission control circuit unit 23. As a result, the output of the NAND circuit 47 indicates "0" and the transistors 29a, 29b, . . . , 29i shift into the ON state, so as to start the oscillation operation of the ring oscillator 17. Then, at the beginning when the pulse of the PWM signal has fallen, the output of the NAND circuit 47 is maintained by the operation of the NAND circuit 47 and the inverter 49 and the oscillation operation of the ring oscillator 17 is maintained. Further, when the pulse of the PWM signal falls and the PWM signal has thus disappeared, the count number of the counter circuit unit 19 becomes a maximum and the QB output of the T flip-flop $33_N$ thus becomes "0". As a result, the transistors 29a, 29b, . . . , 29i are turned into the OFF state, so as to stop the oscillation operation of the ring oscillator 17.

Next, a sequence in which a timing clock is generated in the clock data recovery circuit 11 will be described with reference to FIG. 2.

First, as a PWM signal is input, an initial pulse of the PWM signal rises and, simultaneously, the ring oscillator 17 generates an oscillation pulse signal with a cycle which is sufficiently smaller than the cycle of the PWM signal. Thereafter, the counter circuit unit 19 starts to count a pulse count value from the rising time point A of the pulse in a duration AB of one cycle of the PWM signal. Thereafter, the pulse count value up to the time point B is counted up, and a value obtained by multiplying the pulse count value by a predetermined ratio (0.4~0.6; the representative value is 0.5) is memorized as a reference count value in the register circuit unit 21. Simultaneously, the counter circuit unit 19 is reset at the time point B and the counting by the counter circuit unit 19 is started again. Further, the comparison circuit unit 25 compares the reference count value held by the register circuit unit 21 and the pulse count value counted by the counter circuit unit 19, and raises a timing clock at a time point B1 at which the pulse count value exceeds the reference count value. This timing clock is lowered at a proper time point so as to prevent it from having an influence on the processing of the PWM signal of the next duration CD. Thereafter, this process is repeated and the pulse count value is counted up to the time point C at which the next pulse of the PWM signal starts to rise. Then, a timing clock at the duration CD is generated.

Figure 4:
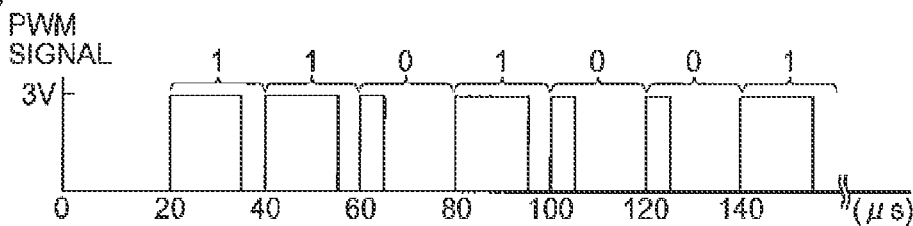
FIGS. 4A to 4C are timing charts of signals processed by the clock data recovery circuit 11 of FIG. 3.
Figure 4:
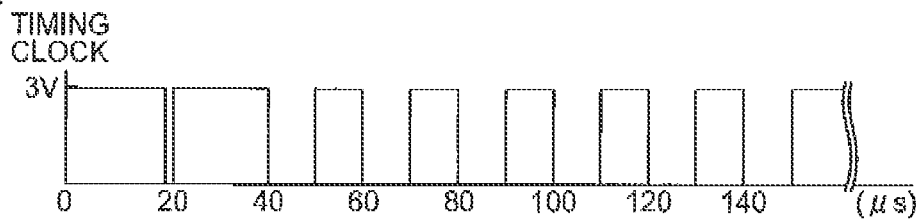
Figure 4:
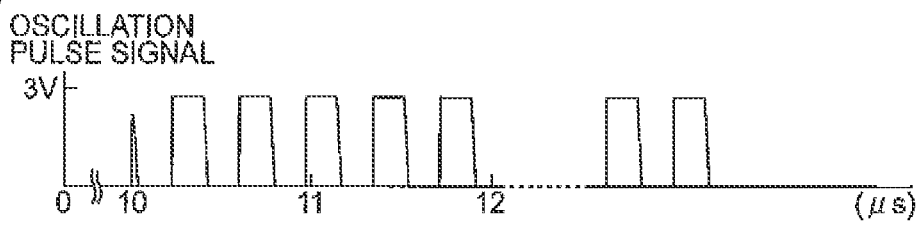
Figure 5:
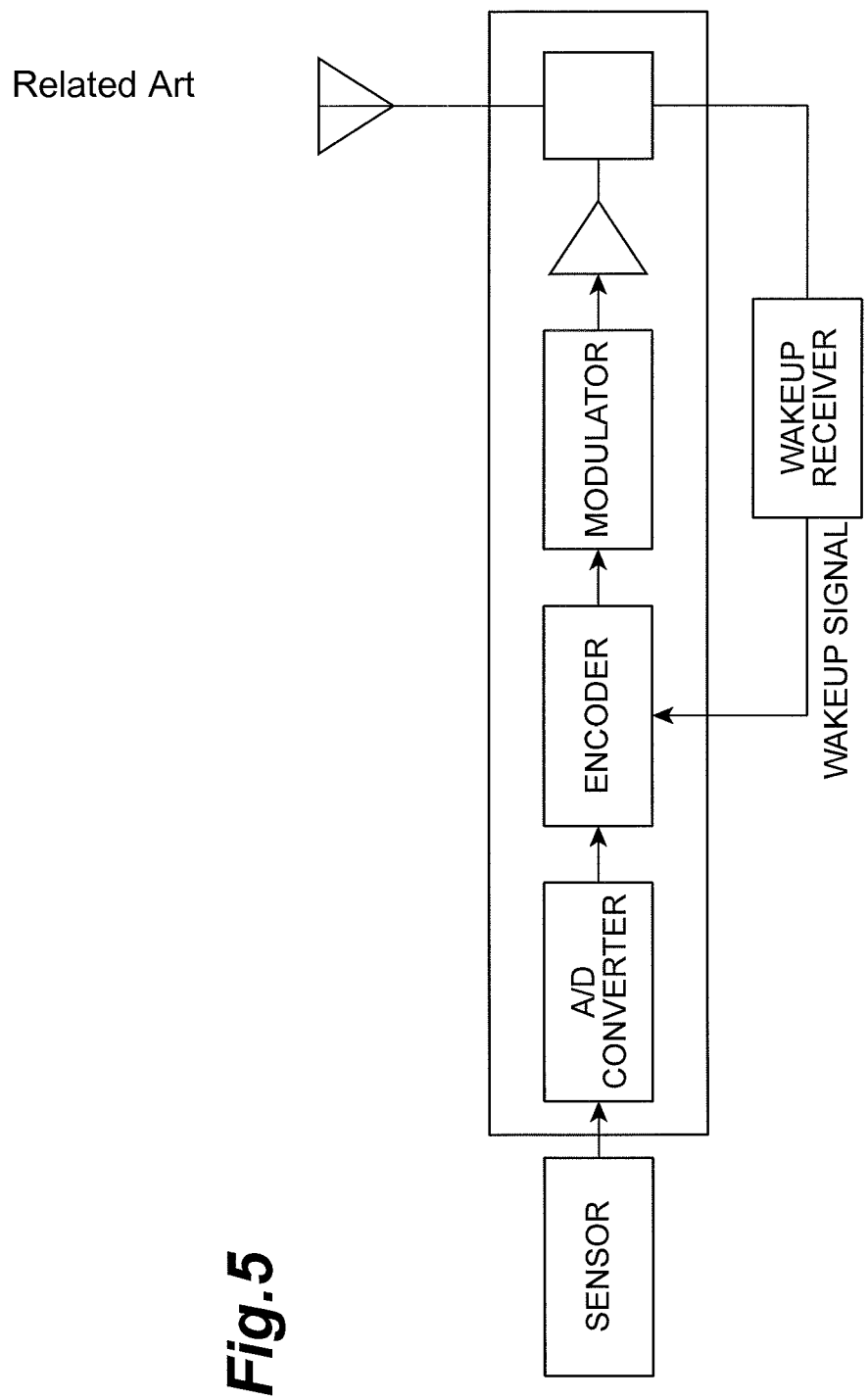
FIG. 5 is a block diagram illustrating an example of the configuration of a conventional sensor apparatus.
Figure 6:
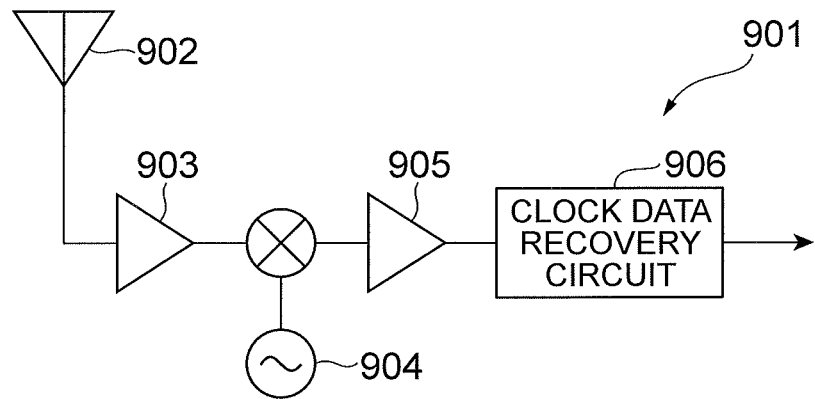
FIG. 6 is a block diagram illustrating an example of the configuration of a wireless receiver constituting the conventional sensor apparatus of FIG. 5.

Further, FIGS. 4A to 4C are timing charts of signals processed by the clock data recovery circuit 11. When a PWM signal with a frequency of 50 kHz as shown in FIG. 4A is input to the clock data recovery circuit 11, an oscillation pulse signal in response to the input of the PWM signal is generated as shown in FIG. 4C. Simultaneously, as shown in FIG. 4B, a timing clock for reading a digital value is generated in each cycle of the PWM signal. From this result, it is possible to understand that, in the clock data recovery circuit 11, a right timing clock is generated from the second bit of the PWM signal. Further, when the input of the PWM signal has disappeared, the ring oscillator 17 is stopped and the operation of the circuit is also stopped after passage of a predetermined time. The clock data recovery circuit 11 showed a normal operation when the frequency of the PWM signal is in the range of 1 kHz to 500 kHz. Moreover, the consumed power was 1.5 µW and the standby power was equal to or smaller than 10 nW. Meanwhile, the frequency range for the normal operation can be freely set according to the use of the circuit.

According to the clock data recovery circuit 11 described above, a pulse count value of an oscillation pulse signal generated by the ring oscillator 17 is held by the counter circuit unit 19, upper bits of the pulse count value are transmitted as a reference count value from the counter circuit unit 19 to the register circuit unit 21 when an input PWM signal rises, and simultaneously, the pulse count value of the counter circuit unit 19 is reset. Further, when the pulse count value of the counter circuit unit 19 exceeds the reference count value, a timing clock is generated. Therefore, since a timing clock for determining a digital value of a PWM signal is generated based on a cycle of another PWM signal one stage before the PWM signal, an oscillator of a high precision is unnecessary. Therefore, it is possible to employ a ring oscillator which has a simple configuration and a small-sized circuit. Further, as a configuration for determining the timing for generation of the timing clock, a configuration of transmitting upper bits of a count value held by the counter circuit unit 19 to the register circuit unit 21 is employed. This configuration is also advantageous in reducing the scale of the circuit. Moreover, the operation of the ring oscillator 17 is stopped when there is no input of a PWM signal, and the timing pulse can rise within two cycles after an input of a PWM signal rises. Therefore, it is possible to effectively reduce the standby power and achieve a rapid rise of the operation. As a result, the present embodiment can reduce both the scale of the circuit and the power consumption.

Further, by increasing the bit number of the counter circuit unit 19 and the register circuit unit 21, it is possible to achieve a normal timing clock generation operation even in spite of a wide range change in the frequency of the PWM signal. Further, even in that case, it is possible to prevent an increase of power consumption.

Figure 7:
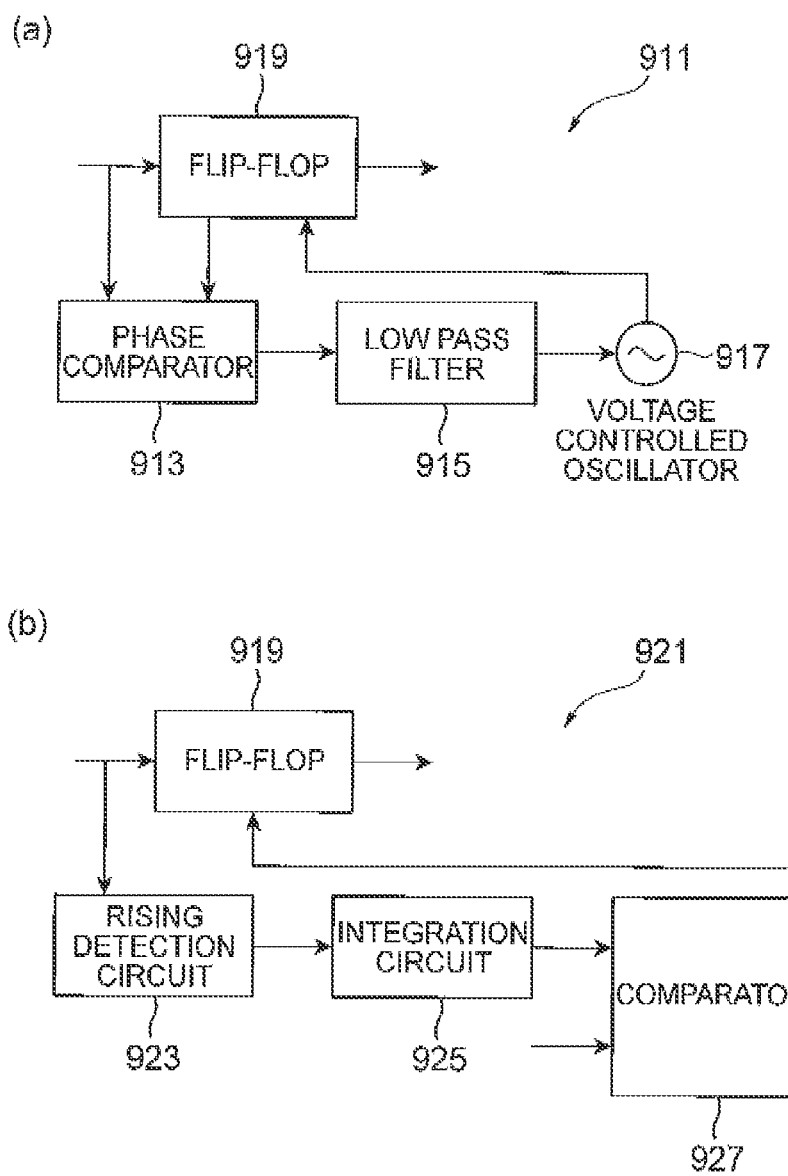
FIGS. 7A and 7B are block diagrams illustrating the configuration of clock data recovery circuits according to comparative examples of the present invention.

FIGS. 7A and 7B illustrate the configurations of clock data recovery circuits according to comparative examples of the present invention. A phase synchronization type clock data recovery circuit 911 shown in FIG. 7A generates a double-frequency oscillation signal phase-synchronized with a rising edge of a PWM signal by a feedback circuit including a phase comparator 913, a low pass filter 915, and a voltage controlled oscillator 917, generates a timing clock from the double-frequency signal, and inputs the generated timing clock to the flip-flop 919. Further, an analog integration type clock data recovery circuit 921 shown in FIG. 7b detects a rising timing of a PWM signal by a rising detection circuit 923, starts the operation of an integration circuit 925 at the rising timing, determines, by a comparator 927, whether an output thereof exceeds a predetermined threshold, and generates a timing clock indicating a result of the determination. In these comparative examples, there is a tendency that the circuit size increases and large power consumption is required. First, the phase synchronization method requires a large area for the resistors and capacitors included in the filter, and the smaller the frequency of the PWM signal, the larger this area. Also, the analog integration method requires a large area for the resistors and capacitors included in the integration circuit. More over, in the analog integration type, both of the integration circuit and the comparator consume power even without a PWM signal. In addition, in both methods, since the frequency range of the PWM signal is nearly fixed at the stage of circuit design, those methods cannot be used when the PWM signal has a wide range of frequency. In contrast, the clock data recovery circuit 11 of the present embodiment can reduce the scale of the circuit to reduce the power consumption, and can achieve a normal operation over a wide frequency range.

Although the principles of the present invention have been illustrated and described through an exemplary embodiment, the present invention is not intended to be limited to the specific configurations disclosed in the present embodiment.

The counter may include N number of flip-flops, which are cascade-connected, as bit counters, the register may have M number of flip-flops as bit registers, and outputs of flip-flops corresponding to upper M bits of the N number of flip-flops of the counter may be connected to inputs of the M number of flip-flops of the register, respectively. Then, it is possible to easily reduce the scale of the circuit for determining the generation timing of the timing clock.

Further, the comparator may compare outputs of the flip-flop corresponding to the lower M bits of the counter with outputs of the M number of flip-flops of the register, respectively. By employing this configuration, it is possible to easily reduce the scale of the circuit for determining the generation timing of the timing clock.

INDUSTRIAL APPLICABILITY

The present invention, which is applicable to a clock data recovery circuit and a wireless module including the same, can reduce the scale of the circuit and reduce the power consumption.

REFERENCE SIGNS LIST

1 ... wireless receiver (wireless module), 3 ... antenna, 9 ... amplifier, 11 ... clock data recovery circuit, 15 ... oscillation control circuit unit (first control circuit unit), 17 ... ring oscillator, 19 ... counter circuit unit, 21 ... register circuit unit, 23 ... transmission control circuit unit (second control circuit unit), 25 ... comparison circuit unit (comparator), $33_1$-$33_N$ ... T flip-flop, $35_1$-$35_M$ ... D flip-flops, $37_1$-$37_M$ ... comparator.

The invention claimed is:

1. A clock data recovery circuit comprising:

an oscillator configured to generate a pulse signal;

a first control circuit unit configured to start and stop an operation of the oscillator according to existence or absence of an input of a Pulse Width Modulation (PWM) signal;

a counter configured to count the pulse signal so as to hold a count value in N number of bit counters, wherein N is an integer greater than 1;

a register including M number of bit registers, wherein M is a natural number smaller than N, the register being configured to transmit upper M bits of the count value held by the N number of bit counters, as a reference count value, in response to input of a transmission signal;

a comparator configured to compare the count value held by the counter with the reference count value held by the register and output a timing clock when the count value exceeds the reference count value; and a second control circuit unit configured to be synchronized with a rising timing of the PWM signal to generate the transmission signal for transmitting the reference count value from the counter to the register and a reset signal for resetting the counter.

2. The clock data recovery circuit of claim 1, wherein the counter comprises N number of cascade-connected flip-flops as the bit counters;

the register comprises M number of flip-flops as the bit registers; and outputs of the flip-flops corresponding to the upper M bits among the N number of flip-flops of the counter are connected to inputs of the M number of flip-flops of the register, respectively.

3. The clock data recovery circuit of claim 2, wherein the comparator compares outputs of the flip-flops corresponding to lower M bits of the counter with outputs of the M number of the flip-flops of the register, respectively.

4. A wireless module comprising:

the clock data recovery circuit of claim 1;

an antenna configured to receive the PWM signal; and an amplifier configured to amplify the PWM signal.

* * * * *